United States Patent [19]
Wheatley, III et al.

[11] Patent Number: 4,646,032

[45] Date of Patent: Feb. 24, 1987

[54] CONTROLLED OSCILLATOR HAVING RANDOM VARIABLE FREQUENCY

[75] Inventors: Charles E. Wheatley, III, Chino; Charles G. Mosley, Irvine; Eugene V. Hunt, El Toro, all of Calif.

[73] Assignee: Rockwell International Corporation, El Segundo, Calif.

[21] Appl. No.: 191,648

[22] Filed: Sep. 22, 1980

[51] Int. Cl.$^4$ .......................................... H03B 29/00
[52] U.S. Cl. .................................. 331/78; 331/177 R
[58] Field of Search .......................... 331/78; 364/717; 375/2.1, 2.2; 343/18 E; 178/22.01, 22.17, 22.19

[56]  References Cited
U.S. PATENT DOCUMENTS

| | | | |
|---|---|---|---|
| 3,659,219 | 4/1972 | Rueff, Jr. | 331/78 |
| 4,056,788 | 11/1977 | Brown et al. | 331/78 |
| 4,218,748 | 8/1980 | Goodwin | 364/717 |
| 4,218,749 | 9/1980 | Babaud et al. | 331/78 |

Primary Examiner—Nelson Moskowitz
Attorney, Agent, or Firm—H. Fredrick Hamann; David J. Arthur

[57] ABSTRACT

Method and apparatus for varying the output signal frequency of a controlled oscillator. The oscillator control signal is formed by filtering the output of a random number generator in such a way that the oscillatory output signal has a random frequency walk phase characteristic having predetermined, controlled characteristics.

14 Claims, 2 Drawing Figures

| n | I | II | III | IV | V | VI |
|---|---|---|---|---|---|---|
| 1 | −1 | 1 | 1 | −2 | −2 | −2 |
| 2 | −1 | −1 | 1 | 2 | 2 | 0 |
| 3 | 1 | −1 | −1 | 2 | 2 | 2 |
| 4 | 1 | 1 | −1 | −2 | −2 | 0 |
| 5 | 1 | −1 | 1 | 2 | 4 | 4 |
| 6 | −1 | −1 | −1 | 2 | 0 | 4 |
| 7 | 1 | 1 | −1 | −2 | −2 | 2 |
| 8 | 1 | 1 | 1 | −2 | 0 | 2 |
| 9 | −1 | 1 | −1 | −2 | −4 | −2 |
| 10 | −1 | −1 | −1 | 2 | 0 | −2 |
| 11 | 1 | 1 | 1 | −2 | 0 | −2 |
| 12 | −1 | 1 | 1 | −2 | −2 | −4 |
| 13 | 1 | −1 | 1 | 2 | 4 | 0 |
| 14 | −1 | −1 | −1 | 2 | 0 | 0 |

FIG.2

CONTROLLED OSCILLATOR HAVING RANDOM VARIABLE FREQUENCY

The invention herein described was made in the course of or under a contract or subcontract thereunder with the Department of the Air Force.

BACKGROUND OF THE INVENTION

This invention relates generally to oscillators and more particularly pertains to an oscillator having controls associated therewith for randomly varying the frequency of the oscillator output signal.

Communication equipments frequently have circuits for tracking the phase or frequency of a signal. An example of such a circuit is a phase locked loop. Such circuits are ordinarily designed to be capable of tracking the signal within specified limits of noisy variation of the signal's phase or frequency. In testing to determine whether the actual tracking capability of a particular embodiment of such a circuit meets design criteria, it is useful to employ an oscillatory signal source in which the signal frequency is randomly varied by a process having known and controllable characteristics.

If a process used to randomly vary the frequency of an oscillator output signal were capable of being faithfully reconstructed, the reconstructed process could be generated and used at a remote signal receiver to remove the noise from the received signal. In such a case, the application of the noise-like variation to the frequency of an oscillator output signal in a controlled manner amounts to scrambling the signal while the subsequent removal of the noise constitutes unscrambling the signal. An example of the use of such a process would be the encoding of pay TV signals such that the reception of such signals would not only require a viewer to obtain the necessary decoding circuitry but would also require a valid code for decoding the picture. Without the code, non-subscribers could not unscramble the picture even though they have built or obtained the necessary decoding box through means other than the pay TV company.

SUMMARY OF THE INVENTION

Accordingly, it is an object of this invention to provide a controlled oscillator having an input control signal varied randomly to correspondingly vary the frequency of the oscillator output signal in such a way that the output signal has a random frequency walk phase characteristic.

Another object of this invention is to provide means for testing the capabilities of tracking circuits such as phase locked loops.

Yet another object of the invention is to provide means for adding phase and frequency noise-like variations to a signal for scrambling the signal wherein the noise may be readily removed at a remote location thereby unscrambling the signal.

A further object of the invention is to provide a method and apparatus for generating an oscillatory signal having noise-like variations in phase and frequency where the variations have well-defined autocorrelation functions.

These and other objects are achieved in an oscillator having means associated therewith for controlling and varying the frequency of the oscillatory output signal in response to random variations of an oscillator input control signal. The input control signal is derived from a first sequence of pulses generated by a binary random number generator at a preselected repetition or sampling rate of 1/T per second. The pulses have the same magnitude but a randomly varying polarity. The first sequence of pulses is delayed once by NT seconds to form a second sequence of pulses and is delayed once again by NT seconds to form a third sequence of pulses, N being a preselected positive number. The first sequence of pulses, minus twice the second series of pulses, and the third sequence of pulses are algebraically summed. Then the sequential instantaneous values of this algebraic sum are accumulated or integrated to form a running sum. The running sum is scaled to form the input control signal for the oscillator. The scale factor or frequency stepsize, K, a positive number, is preselected at a desired value. A unit change in the value of the running sum changes the oscillator input control signal by an amount which varies the frequency of the oscillatory output signal by K radians per second.

In effect, the output of the binary random number generator is filtered by the above-described operations to form the oscillator input control signal. The phase noise and the frequency noise induced in the oscillatory output signal by the random variations of this control signal have well-defined autocorrelation functions due to this filtering process. The mean square power in the phase variation, the mean square power in the frequency variation, and the decorrelation times for the phase and frequency variations may each be independently predetermined by jointly preselecting values for the clock period T (reciprocal of pulse repetition rate), the number of clock periods in each of the two delays, N, and the scale factor, K. Since the circuitry for the filter is primarily digital, it is simple to mechanize and is relatively easy to modify to provide differing noise powers and decorrelation times. This is done by changing the joint selections for T, N and K.

BRIEF DESCRIPTION OF THE DRAWINGS

FIG. 2 is a table illustrating samples of the various signals generated in the system of FIG. 1.

DESCRIPTION OF THE PREFERRED EMBODIMENT

Figure 1:
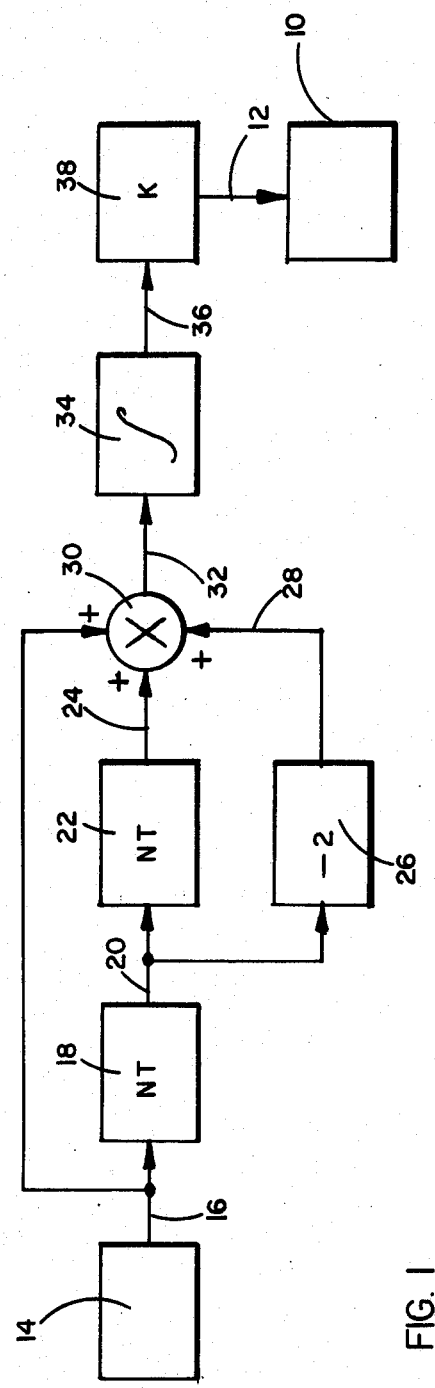
FIG. 1 shows a block diagram of a controlled oscillator according to the invention.

Phase noise can be described in terms of the phase noise power spectral density $S(\omega)$ in the frequency domain or by a measure of frequency variance versus averaging time in the time domain. The phase noise generated may be modeled by the following spectral density terms: white phase noise, flicker phase noise, random phase walk or white frequency noise, flicker frequency noise and random frequency walk noise. The objective of this invention is to provide a method of generating the random frequency walk noise having controllable characteristics on an oscillator signal. The power spectral density of a random frequency walk is a $K/f^4$ process which is approximated by the function $$\frac{\psi \sin^4 \xi}{\xi^4}.$$

This process can be implemented in hardware or software by the functional block diagram shown in FIG. 1.

Referring now to FIG. 1, there is indicated at 10 an oscillator of the type wherein the frequency of its oscillatory output signal is controlled and varied in response to an oscillator input control signal appearing on line 12.

One type of oscillator 10 suitable for use in practicing the invention is the voltage-controlled oscillator. When this type of oscillator is used, the signal appearing on the line 12 is an analog quantity. Another suitable type of oscillator 10 is the digital frequency synthesizer. When the latter type of oscillator is used, the signal appearing on the line 12 is typically a digital word. In fact, wherever a signal is described as a sequence of pulses in this specification, or in the claims, it is equally appropriate to consider the signal to be a sequence of digital words.

The oscillator input control signal originates in a binary random number generator 14. The generator may be any suitable type of random number generator or coder which generates a sequence of pulses, all having the same constant magnitude and having a randomly varying polarity. The pulses are generated at a preselected sampling or repetition rate of 1/T per second. A simple type of random number generator suitable for use with the invention is the well-known shift-register pseudo random number generator wherein the contents of two or more cells of a shift register are added together and the sum is fed back into the register's input.

The pulse sequence output by the generator 14 on line 16 (first pulse sequence) is delayed by NT seconds in a first delay circuit 18 where N is a positive number and T is the clock period. The output of delay circuit 18 is a second pulse sequence appearing on line 20. The second pulse sequence is delayed again by NT seconds in a second delay circuit 22. The output of delay circuit 22 is a third pulse sequence appearing on line 24. Without any additional delay, the magnitude of the second pulse sequence on line 20 is multiplied by two and inverted to reverse its polarity in an amplifier 26. The output of the amplifier 26 is algebraically summed by the summer 30 with the first and third pulse sequences mentioned above.

Delay circuits 18 and 22 may be implemented using shift registers having N cells.

The output of the summer 30 appearing on line 32 is applied to an accumulator or integrator 34. The integrator 34 operates to accumulate a running sum of the sequential instantaneous values of the algebraic sum on line 32. The running sum appearing on line 36 is then scaled in the scaler 38 to provide the input control signal on line 12. The frequency step size or scale factor K of the scaler 38 is chosen to be such that a unit change in the value of the running sum on line 36 changes the input control signal on line 12 by an amount which varies the frequency of the output signal of the oscillator 10 by K radians per second.

The scaler 38 is preferably implemented to provide the input control signal on line 12 as a digital word for use by a digital frequency synthesizer. Where the oscillator 10 is controlled by an analog signal such as, for example, in the case of a voltage-controlled oscillator, the scaler 38 includes a digital-to-analog converter for providing the analog input control signal.

The random number generator 14, the shift register delay circuits 18 and 22, the algebraic summer 30, the accumulator 34 and the scaler 38 are preferably all driven synchronously by the same clock signal operating at a repetition rate of 1/T frames per second.

In the table of FIG. 2, the columns contain examples of the various pulse sequences which are present in a oscillator according to the invention. Each entry in the table has an algebraic sign indicating polarity and a numerical value representing amplitude. Column I represents the first pulse sequence output by the binary random number generator 14. Column II represents the second pulse sequence delayed from the first pulse sequence by 4T seconds as output by the first time delay device 18. Column III represents the third pulse sequence delayed from the second pulse sequence by 4T seconds as output by the second time delay device 22. Column IV represents the second pulse sequence of Column II multiplied by two and inverted. Column V contains the instantaneous algebraic sum of the sequences in Columns I, III and IV. Column VI contains the running sum of the instantaneous sequential values of the algebraic sum in Column V. The numbered rows of the table in FIG. 2 represent sequential intervals of time of length T seconds. For this example, the accumulator for the running sum of Column VI is set at zero for cycles prior to cycle 1.

The random variable output of the generator 14 of FIG. 1 is filtered by the time delays 18 and 22, the amplifier 26, the summer 30, the integrator 34 and the scaler 38. It can be shown that the frequency variant portion of the transfer function for the filter is as follows:

$$\frac{\Delta f}{v} = \frac{[1 - e^{-NTs}]^2}{1 - e^{-Ts}} \quad (1)$$

where $\Delta f$ is the change in frequency of the oscillator 10 due to the generator 14 output v.

As derived from the transfer function given in Equation 1 above, the spectral density of the phase noise in the oscillatory output signal of the oscillator 10 is as follows:

$$S(\omega) = PT^3K^2N^4 \frac{\sin^4(NT\omega/2)}{(NT\omega/2)^4} \quad (2)$$

where
P is the normalized input power of the random number generator 14,
T is the clock period or sampling update period, seconds,
K is frequency step size, radians/second/volt,
N is shift register length and
$\omega$ is frequency in radians per second.

P is fixed by the choice of a particular binary random number generator.

It follows, then, that the autocorrelation function for the phase noise is as follows:

$$R_\phi(\tau) = R_\phi(0)\left[1 - \frac{3}{2}\frac{\tau^2}{(NT)^2} + \frac{3}{4}\frac{\tau^3}{(NT)^3}\right] \text{ radian}^2 \quad (3)$$

for $0 \leq \tau \leq NT$, $$R_\phi(\tau) = R_\phi(0)\left[2 - 3\frac{\tau}{(NT)} + \frac{3}{2}\frac{\tau^2}{(NT)^2} - \frac{1}{4}\frac{\tau^3}{(NT)^3}\right] \text{ radians}^2 \quad (4)$$

for $NT \leq \tau \leq 2NT$, and $$R_\phi(\tau) = 0 \text{ radian}^2 \text{ for } \tau > 2NT. \quad (5)$$

where $\tau$ is the correlation interval, and where the mean square noise power of the phase variation is $$R_\phi(0) = (\tfrac{2}{3})PT^2K^2N^3 \text{ radians}^2. \tag{6}$$

In the same manner, the autocorrelation function for the frequency noise is as follows:

$$R_\phi'(\tau) = \frac{3R_\phi(0)}{(NT)^2}\left[1 - \tfrac{3}{2}\,\frac{\tau}{NT}\right] \text{(radians/second)}^2 \tag{7}$$
for $0 < \tau \leq NT$, $$R_\phi'(\tau) = \frac{3R_\phi(0)}{(NT)^2}\left[-1 + \tfrac{1}{2}\,\frac{\tau}{NT}\right] \text{(radians per second)}^2 \tag{8}$$
for $NT \leq \tau \leq 2NT$, and $$R_\phi'(\tau) = 0 \text{ (radian/sec)}^2 \text{ for } \tau > 2NT \tag{9}$$

It follows, then, that the mean square power in the frequency noise is:

$$R_{\phi'}(0) = 2PK^2N \text{ (radians/sec)}^2 \tag{10}$$

An examination of the equations above reveals the following useful features and advantages of the invention. First, the correlation functions for both phase and frequency noise are well defined. Second, after a decorrelation time of 2NT, the noise variations are uncorrelated. Lastly, and importantly, it is apparent that the mean square power in the phase noise (Equation 6), the mean square power in the frequency noise (Equation 10) and the decorrelation time 2NT may all be independently set at desired values by suitable joint selections of the values for K, N and T.

While the invention has been described with respect to the preferred embodiment thereof, it will be understood by those skilled in the art that various changes in form and details may be made therein without departing from the spirit and scope of the invention.

What is claimed is:

1. Apparatus for generating an oscillatory output signal, comprising:
  an oscillator having means associated therewith for controlling and varying the frequency of said oscillatory output signal in response to variations of an oscillator input control signal; and
  means for generating said oscillator input control signal, comprising:
    a binary random number generator generating a first sequence of pulses having a constant magnitude and randomly varying polarity;
    a first time delay device operating on said first sequence of pulses to produce a second sequence of pulses delayed in time from said first sequence of pulses;
    a second time delay device operating on said second sequence of pulses to produce a third sequence of pulses delayed in time from said second sequence of pulses;
    means for forming the algebraic sum of said first sequence of pulses, minus twice said second sequence of pulses, and said third sequence of pulses;
    means for accumulating a running sum of the sequential instantaneous values of said algebraic sum; and
    means for scaling the magnitude of said running sum to form said oscillator input control signal.

2. The apparatus recited in claim 1,
  wherein said sequences of pulses are generated and propagated at a preselected repetition rate of 1/T per second,
  wherein the time delays of said first and second time delay devices are the same and equal to NT seconds,
  wherein the frequency of said oscillatory output signal, is changed by K hertz for each unit change in the value of said running sum, and
  wherein T, N and K are jointly preselected to provide independently selected values for the mean square phase noise power, the mean square frequency noise power and the decorrelation time for said phase noise and said frequency noise in said oscillatory output signal.

3. The apparatus recited in claim 2, wherein said first and second time delay devices each comprise a shift register having N cells.

4. The apparatus recited in claim 1, wherein said oscillator is a digital frequency synthesizer.

5. The apparatus recited in claim 1, wherein said oscillator is a voltage-controlled oscillator.

6. The apparatus recited in claim 5, wherein said means for scaling the magnitude of said running sum includes a digital-to-analog converter.

7. The apparatus recited in claim 1, wherein said binary random number generator is a pseudo random number generator.

8. The apparatus recited in claim 7, wherein said pseudo random number generator comprises a shift register, wherein two or more cells of said shift register are summed, and wherein the sum is fed back into said shift register's inputs.

9. A method of generating a control signal for an oscillator having a controllably variable output signal frequency, comprising the steps of:
  generating a first sequence of pulses having a constant magnitude and randomly varying polarity, wherein said pulses are generated at a preselected repetition rate of 1/T per second;
  delaying said first sequence of pulses by NT seconds to produce a second sequence of pulses, where N is a preselected positive number;
  delaying said second sequence of pulses by NT seconds to produce a third sequence of pulses;
  forming the algebraic sum of said first sequence of pulses, minus twice said second sequence of pulses, and said third sequence of pulses;
  accumulating a running sum of the sequential instantaneous values of said algebraic sum; and
  scaling the magnitude of said running sum to form an input control signal for said oscillator, wherein a unit change in the value of said running sum changes said input control signal by an amount which varies the frequency of said oscillatory output signal by K radians per second, wherein K is a preselected positive number.

10. The method recited in claim 9, further comprising the step of jointly selecting T, N and K to provide independently selected values for the mean square phase noise power, the mean square frequency noise power and the decorrelation time for said phase noise and said frequency noise in said oscillatory output signal.

11. A method of varying the frequency of the output signal of an oscillator, wherein said oscillator has means associated therewith for varying the frequency of said output signal in response to variations of an oscillator input control signal; said method comprising:
  generating a noise signal having predetermined controlled characteristics;
  using said noise signal as said input control signal; and
  independently predetermining the mean square power in the phase variation, the mean square power in the frequency variation and the decorrelation times for said phase and frequency variations of said output signal.

12. The method recited in claim 11, wherein said output signal has a random frequency walk phase characteristic.

13. A method of varying the frequency of the output signal of an oscillator, wherein said oscillator has means associated therewith for varying the frequency of said output signal in response to variations of an oscillator input control signal; said method comprising:
  generating a noise signal having predetermined controlled characteristics; and
  using said noise signal as said input control signal;
  wherein values for the mean square power in the phase variation, the mean square power in the frequency variation and the decorrelation times for said phase and frequency variations in said output signal are each independently predetermined.

14. The method recited in claim 13, wherein said output signal has a random frequency walk phase characteristic.

* * * * *